(12) United States Patent
Sonoda et al.

(10) Patent No.: US 9,673,794 B2
(45) Date of Patent: Jun. 6, 2017

(54) NOISE ANALYSIS APPARATUS, ELECTRONIC DEVICE, AND NOISE-SOURCE IDENTIFICATION SYSTEM

(71) Applicant: Mitsubishi Electric Corporation, Tokyo (JP)

(72) Inventors: Satoru Sonoda, Tokyo (JP); Kengo Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/906,808

(22) PCT Filed: Jun. 2, 2014

(86) PCT No.: PCT/JP2014/064623
§ 371 (c)(1),
(2) Date: Jan. 21, 2016

(87) PCT Pub. No.: WO2015/186175
PCT Pub. Date: Dec. 10, 2015

(65) Prior Publication Data
US 2016/0182027 A1 Jun. 23, 2016

(51) Int. Cl.
*H03K 5/1252* (2006.01)
*H03K 19/173* (2006.01)
*H03K 5/00* (2006.01)

(52) U.S. Cl.
CPC ......... *H03K 5/1252* (2013.01); *H03K 19/173* (2013.01); *H03K 2005/00013* (2013.01)

(58) Field of Classification Search
None
See application file for complete search history.

(56) References Cited

U.S. PATENT DOCUMENTS 4,961,014 A 10/1990 Kasahara
5,502,711 A * 3/1996 Clark .................. H03L 7/07
360/51

(Continued)

FOREIGN PATENT DOCUMENTS

JP  01-115213 A  5/1989
JP  01-297913 A  12/1989

(Continued)

OTHER PUBLICATIONS

Japanese Decision of a Patent Grant issued in JP 2015-519662 dated Jun. 2, 2015.

(Continued)

*Primary Examiner* — Douglas W Owens
*Assistant Examiner* — James H Cho
(74) *Attorney, Agent, or Firm* — Sughrue Mion, PLLC; Richard C. Turner (57) ABSTRACT

A noise analysis apparatus has a plurality of digital filters and a noise analysis unit. The plurality of digital filters have mutually different filtering characteristics and filter a same input signal to output a plurality of output signals, respectively. The noise analysis unit detects presence or absence of a noise in the input signal, based on the plurality of output signals. More specifically, the noise analysis unit detects the presence or absence of the noise in the input signal, based on whether or not values of the plurality of output signals coincide with each other.

10 Claims, 12 Drawing Sheets (56) References Cited

U.S. PATENT DOCUMENTS

| | | | |
|---|---|---|---|
| 6,414,540 B2 | 7/2002 | Drexler | |
| 6,546,057 B1 * | 4/2003 | Yeap | H04B 1/10 |
| | | | 375/285 |
| 7,821,437 B1 | 10/2010 | Rud et al. | |
| 2010/0195779 A1 * | 8/2010 | Sai | H03L 7/087 |
| | | | 375/376 |
| 2015/0207557 A1 * | 7/2015 | Kasai | H03F 1/26 |
| | | | 375/349 |

FOREIGN PATENT DOCUMENTS

| | | | |
|---|---|---|---|
| JP | 11-214964 A | 8/1999 |
| JP | 2000-134070 A | 5/2000 |
| JP | 2000-286685 A | 10/2000 |
| JP | 2001-211057 A | 8/2001 |
| JP | 2001-352579 A | 12/2001 |
| JP | 2002-204147 A | 7/2002 |
| JP | 2003-148997 A | 5/2003 |
| JP | 2004-185570 A | 7/2004 |
| JP | 2004-233235 A | 8/2004 |
| JP | 2007-201619 A | 8/2007 |
| JP | 2012-105455 A | 5/2012 |
| JP | 2012-523758 A | 10/2012 |
| JP | 2014-023066 A | 2/2014 |

OTHER PUBLICATIONS

International Search Report of PCT/JP2014/064623 dated Aug. 26, 2014.
Communication dated Apr. 7, 2016 from Korean Intellectual Property Office in counterpart Application No. 10-2016-7001181.

* cited by examiner

| OUT1 | 0 | 1 | 1 | 1 | 1 |
|---|---|---|---|---|---|
| OUT2 | 0 | 0 | 1 | 1 | 1 |
| OUT3 | 0 | 0 | 0 | 1 | 1 |
| OUT4 | 0 | 0 | 0 | 0 | 1 |
| NOISE DETECTION | 0 | 1 | | | 0 |
| NOISE MAGNITUDE | | SMALL→LARGE | | | |

FIG.12

1: NOISE ANALYSIS APPARATUS

NOISE ANALYSIS APPARATUS, ELECTRONIC DEVICE, AND NOISE-SOURCE IDENTIFICATION SYSTEM

CROSS REFERENCE TO RELATED APPLICATIONS

This is a National Stage of International Application No. PCT/JP2014/06423 filed Jun. 2, 2014, the contents of which are incorporated herein by reference in its entirety.

FIELD

The present invention relates to a noise analysis apparatus, an electronic device, and a noise-source identification system.

BACKGROUND

When an electronic device is operated in an environment in which a noise is generated, the noise may adversely affect an operation of the electronic device. Therefore, a digital filter for removing noises is used in some cases (see, for example, Patent Literature 1). For example, an input unit of a sequencer takes in an input signal from a device such as a switch and a sensor through the digital filter.

However, the digital filter cannot detect presence or absence of a noise nor a noise level, although the digital filter can remove a noise. Information such as the presence or absence of a noise and the noise level is useful for identifying a source of noises, for example, and it is desirable to obtain such information.

Patent Literature 2 discloses a motor control device. The motor control device is provided with an inverter circuit and a current detection device that detects three-phase alternating-current output currents of the inverter circuit. A clock signal and a data signal of an AD converter are input to the current detection device. Then, the number of clocks in a certain period of time is measured to detect a noise level.

CITATION LIST

Patent Literatures

Patent Literature 1: Japanese Patent Application Laid-open No. 2000-134070
Patent Literature 2: Japanese Patent Application Laid-open No. 2012-105455

SUMMARY

Technical Problem

An object of the present invention is to provide a technique that can detect presence or absence of a noise with a simple configuration.

Solution to Problem

In an aspect of the present invention, a noise analysis apparatus is provided. The noise analysis apparatus has a plurality of digital filters and a noise analysis unit. The plurality of digital filters have mutually different filtering characteristics and filter a same input signal to output a plurality of output signals, respectively. The noise analysis unit detects presence or absence of a noise in the input signal, based on the plurality of output signals. More specifically, the noise analysis unit detects the presence or absence of the noise in the input signal, based on whether or not values of the plurality of output signals coincide with each other.

Advantageous Effects of Invention

According to the present invention, it is possible to detect presence or absence of a noise with a simple configuration.

DESCRIPTION OF EMBODIMENTS

Exemplary embodiments of the present invention will be described below with reference to the accompanying drawings.

Figure 1:
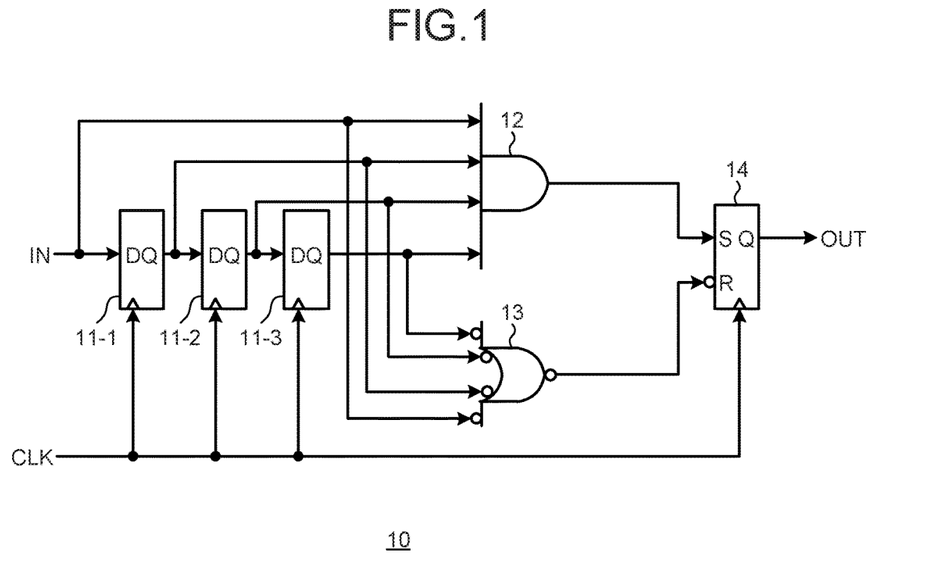
FIG. 1 is a circuit diagram showing an example of a configuration of a digital filter used in a first embodiment of the present invention.

First Embodiment.
<Configuration Example of Digital Filter>
FIG. 1 is a circuit diagram showing an example of a configuration of a digital filter 10 used in the present embodiment. The digital filter 10 receives an input signal IN and outputs an output signal OUT. More specifically, the digital filter 10 has a plurality of D flip-flops 11, an AND circuit 12, a negative logic OR circuit 13, and an RS flip-flop 14.

The plurality of D flip-flops 11 (three-staged D flip-flops 11-1 to 11-3 in the example shown in FIG. 1) are connected in series so as to form a shift register. The input signal IN is supplied to the first-stage D flip-flop 11-1. Each of the D flip-flops 11 operates based on a clock signal CLK, and thereby the input signal IN is shifted sequentially in the shift register.

The input signal IN and respective output signals from the plurality of D flip-flops 11 are input to the AND circuit 12 and the negative logic OR circuit 13. An output signal of the AND circuit 12 is input to a set terminal of the RS flip-flop 14. An output signal of the negative logic OR circuit 13 is input to a reset terminal of the RS flip-flop 14. The RS flip-flop 14 also operates based on the clock signal CLK. An output signal of the RS flip-flop 14 is the output signal OUT mentioned above.

As a result of the configuration described above, the digital filter 10 takes in the input signal IN and outputs the same signal as the output signal OUT, if there is no change in the input signal IN for a predetermined filtering time. To put it the other way around, the digital filter 10 removes, as a noise, a pulsed change whose duration is shorter than the predetermined filtering time. The predetermined filtering time is given by the following expression (1).

[Filtering time]=[the number of stages in the shift register]×[clock period]    Expression (1)

It is therefore possible to adjust characteristics of the noise which the digital filter 10 can remove, by changing the number of stages of the D flip-flops 11 forming the shift register or a frequency of the clock signal CLK.

Figure 2:
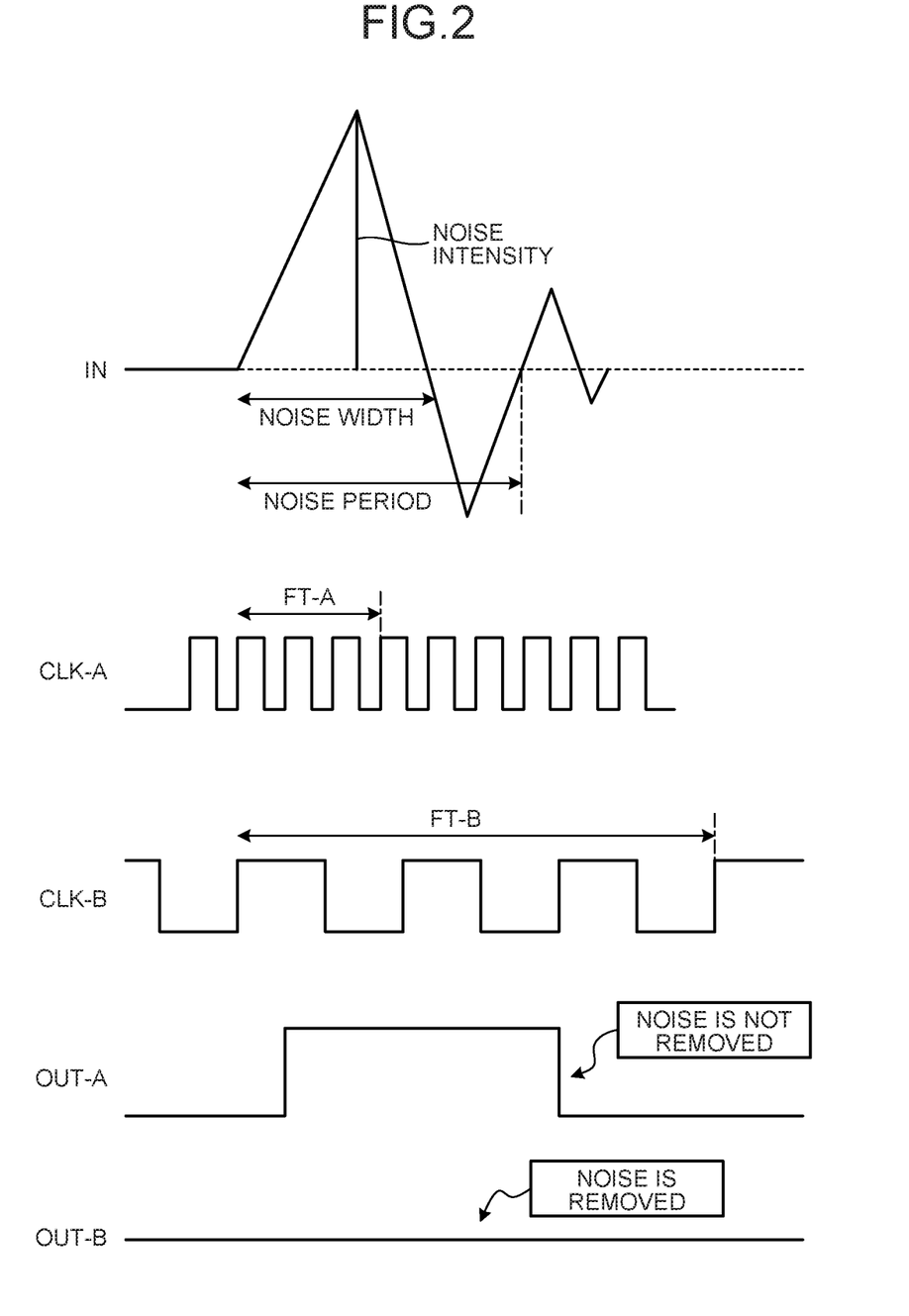
FIG. 2 is a conceptual diagram for explaining a relationship between a noise and a filtering time of the digital filter.
Figure 3:
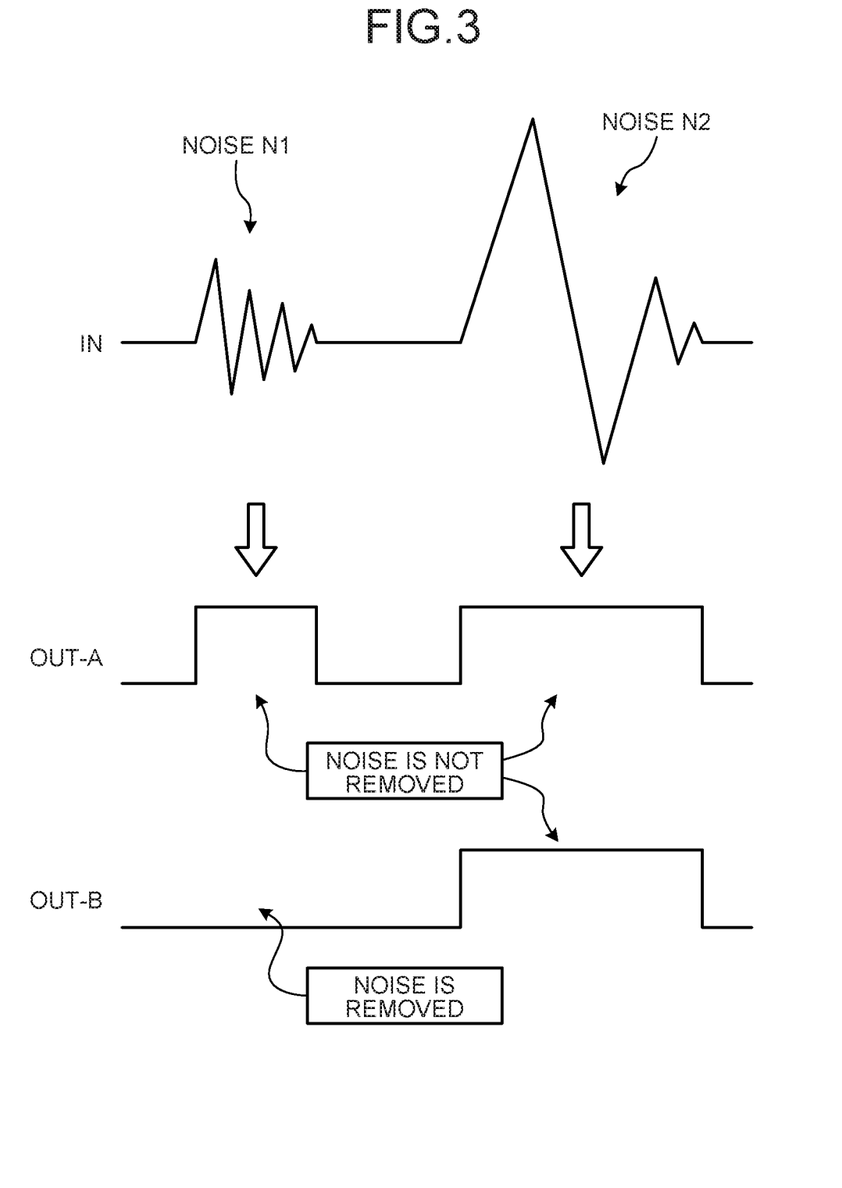
FIG. 3 is a conceptual diagram for explaining a relationship between a noise and a filtering time of the digital filter.

FIGS. 2 and 3 are conceptual diagrams for explaining a relationship between a noise and the filtering time of the digital filter 10. A case where a noise is removed and a case where a noise is not removed will be described with reference to FIGS. 2 and 3. It should be noted that parameters defining the characteristics of a noise include a noise period, a noise width, and a noise intensity (a noise amplitude), as shown in FIG. 2.

Here, as an example, let us consider two digital filters 10-A and 10-B. It is assumed that the digital filters 10-A and 10-B are the same in the number of stages in the shift register, but are different in the clock period. More specifically, as shown in FIG. 2, a period of a clock signal CLK-A input to the digital filter 10-A is shorter than a period of a clock signal CLK-B input to the digital filter 10-B. As a result, a filtering time FT-A of the digital filter 10-A is shorter than a filtering time FT-B of the digital filter 10-B.

Let us consider a case where a noise whose noise period is longer than the filtering time FT-A and shorter than the filtering time FT-B is input to each of the digital filters 10-A and 10-B, as shown in FIG. 2. In this case, the digital filter 10-A whose filtering time FT-A is shorter than the noise period cannot completely remove the noise. As a result, a signal corresponding to the noise comes to be mixed in an output signal OUT-A from the digital filter 10-A. On the other hand, the digital filter 10-B whose filtering time FT-B is longer than the noise period can remove the noise. As a result, the noise is not reflected in an output signal OUT-B from the digital filter 10-B.

Next, by reference to FIG. 3, let us consider a case where two types of noises N1 and N2 are input. The noise period of the noise N2 is longer than that of the noise N1. Generally, the longer the noise period is, the higher the noise intensity is. That is, the intensity of the noise N2 is higher than that of the noise N1. In the following description, a noise having a long noise period and a high noise intensity may be referred to as a "large noise". Meanwhile, a noise having a short noise period and a low noise intensity may be referred to as a "small noise".

In the example shown in FIG. 3, as for the small noise N1, the digital filter 10-A does not remove the noise N1, but the digital filter 10-B removes the noise N1. However, as for the large noise N2, neither the digital filters 10-A nor 10-B removes the noise N2. That is, even when the same digital filters 10-A and 10-B are used, a combination of the output signals OUT-A and OUT-B varies depending on a "noise magnitude". To put it the other way around, it is possible to obtain information on the "noise magnitude" from the combination of the output signals OUT-A and OUT-B from the respective digital filters 10-A and 10-B having mutually different filtering times.

The invention of the present application is based on the knowledge described above with reference to FIGS. 2 and 3.

It should be noted that the configuration of the digital filter 10 is not limited to that shown in FIG. 1. For example, the configuration described in Patent Literature 1 also is possible.

<Configuration Example of Noise Analysis Apparatus>

Figure 4:
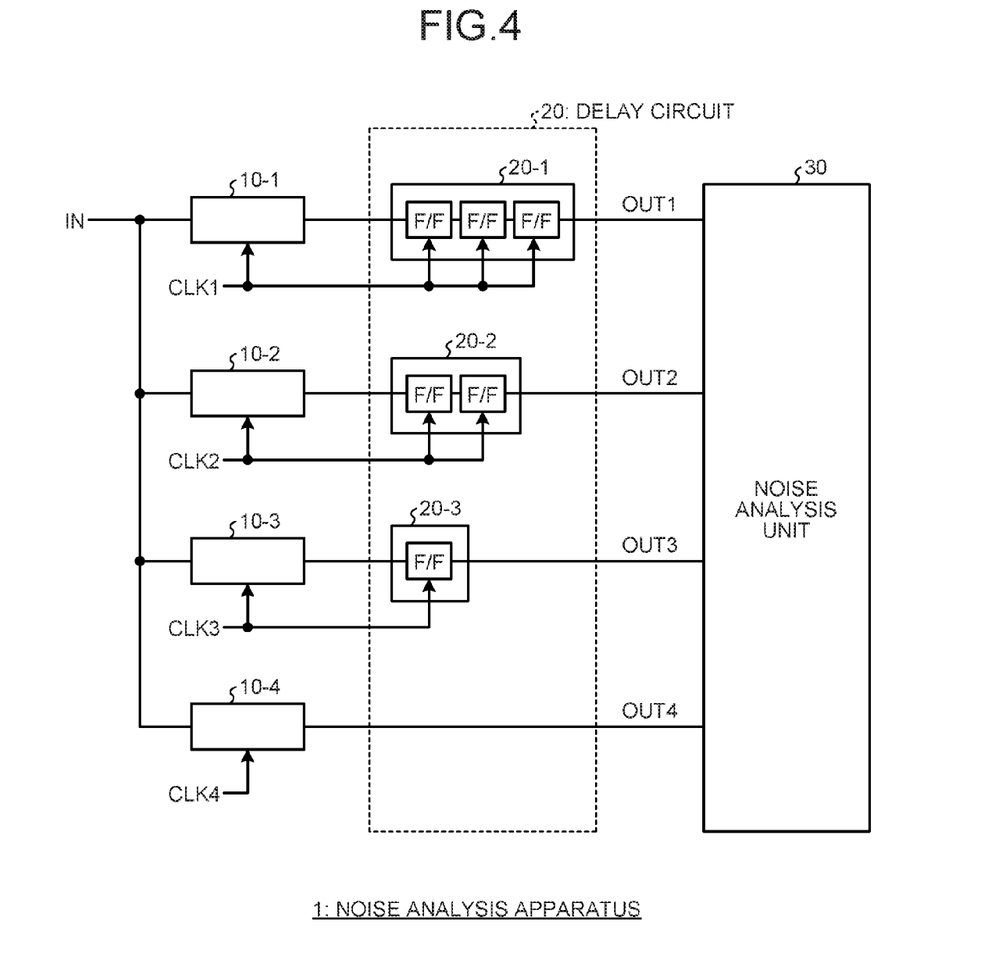
FIG. 4 is a block diagram showing an example of a configuration of a noise analysis apparatus according to the first embodiment of the present invention.
Figure 5:
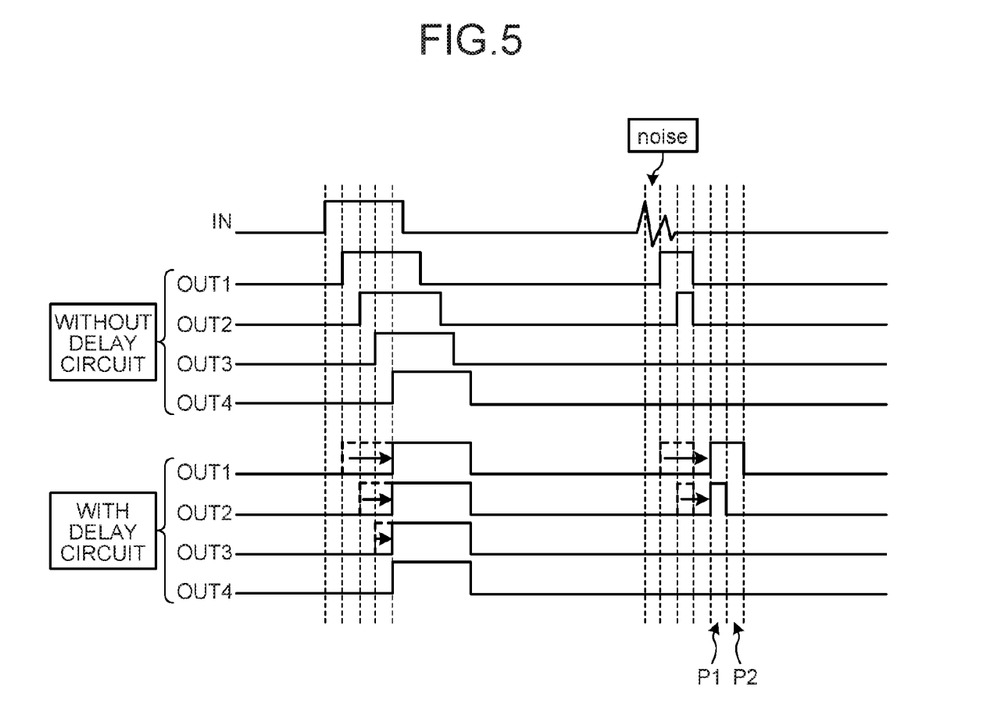
FIG. 5 is a timing chart showing an example of an operation of the noise analysis apparatus according to the first embodiment of the present invention.

According to the present embodiment, it is possible to detect presence or absence of a noise with a simple configuration by using a plurality of digital filters 10 described above. FIG. 4 is a block diagram showing an example of a configuration of a noise analysis apparatus 1 having such the function. FIG. 5 is a timing chart showing an example of an operation of the noise analysis apparatus 1.

The noise analysis apparatus 1 shown in FIG. 4 has a plurality of digital filters 10-1 to 10-4, a delay circuit 20, and a noise analysis unit 30. Note that the number of the plurality of digital filters 10 is not limited to four.

The same input signal IN is input in common to the plurality of digital filters 10-1 to 10-4. The plurality of digital filters 10-1 to 10-4 then perform filtering of the input signal IN based on clock signals CLK1 to CLK4 to output a plurality of output signals OUT1 to OUT4, respectively. It should be noted that periods (frequencies) of the clock signals CLK1 to CLK4 may be different from each other or may be the same.

According to the present embodiment, the plurality of digital filters 10-1 to 10-4 have mutually different filtering characteristics. More specifically, the above-mentioned filtering time (that is, the period of noise that can be removed) differs between the plurality of digital filters 10-1 to 10-4. Such the configuration can be achieved by adjusting the numbers of stages in the shift registers or the periods of the clock signals in the respective digital filters 10-1 to 10-4.

As an example, let us consider a case where the filtering time of the digital filer 10-1 is the shortest and the filtering time is increased in a stepwise manner in an order of the digital filters 10-2, 10-3 to 10-4. In this case, there is a possibility that both a digital filter 10 that can remove a noise and a digital filter 10 that cannot remove the noise exist. For example, in the example shown in FIG. 5, the digital filters 10-3 and 10-4 remove a noise, whereas the digital filter 10-1 does not remove the noise and the digital filter 10-2 does not remove a part of the noise. As a result, the noise is reflected in the output signals OUT1 and OUT2 from the digital filters 10-1 and 10-2. That is, respective values of the output signals OUT1 to OUT4 from the digital filters 10-1 to 10-4 filtering the same input signal IN do not coincide with each other.

The noise analysis unit 30 receives such the output signals OUT1 to OUT4 from the respective digital filters 10-1 to 10-4, and performs an analysis of the noise in the input signal IN based on the received output signals OUT1 to OUT4. Examples of the function of the noise analysis unit 30 will be described later. It should be noted that the noise analysis unit 30 can be configured by a logic circuit or a processor such as a microcomputer. Alternatively, the noise analysis unit 30 can be a combination of a logic circuit and a processor.

In a case where a signal delay amount differs between the plurality of digital filters 10-1 to 10-4, it is preferable that the delay circuit 20 is provided between the digital filters 10-1 to 10-4 and the noise analysis unit 30, as shown in FIG. 4. As shown in FIG. 5, the delay circuit 20 plays a role of reducing a difference in the signal delay generated between the digital filters 10-1 to 10-4. That is, the delay circuit 20 synchronizes the output signals OUT1 to OUT4 from the respective digital filters 10-1 to 10-4 with each other. In the example shown in FIGS. 4 and 5, delay elements 20-1, 20-2, and 20-3 having mutually different delay amounts are arranged on signals lines of the respective output signals OUT1, OUT2, and OUT3 to form the delay circuit 20.

Due to the delay circuit 20 described above, accuracy of analysis by the noise analysis unit 30 is improved. Note that when there is no difference in the signal delay between the plurality of digital filters 10 in principle, the delay circuit 20 is not necessary.

The plurality of digital filters 10 may include those having the same filtering time. In this case, even if a part of the digital filters 10 having the same filtering time fails, it may be possible to detect the noise based on the signal from a normal digital filter 10, which means increase in the accuracy of analysis. Moreover, even if a delay of the clock signal is caused by a substrate interconnection pattern or the like, filtering of the same input waveform is performed at multiple points, which means increase in the accuracy of the noise analyses.

<Various Examples of Function of Noise Analysis Unit 30>

As described above, the values of the output signals OUT1 to OUT4 from the digital filters 10-1 to 10-4 filtering the same input signal IN do not coincide with each other in some cases. This means that a noise is caused in the input signal IN. Therefore, the noise analysis unit 30 can detect presence or absence of a noise in the input signal IN, based on whether or not the values of the output signals OUT1 to OUT4 coincide with each other. That is, in a case where the values of the output signals OUT1 to OUT4 coincide with each other, the noise analysis unit 30 determines that there is no noise in the input signal IN. On the other hand, in a case where the values of the output signals OUT1 to OUT4 do not coincide with each other, the noise analysis unit 30 determines that there is a noise in the input signal IN.

Figure 6:
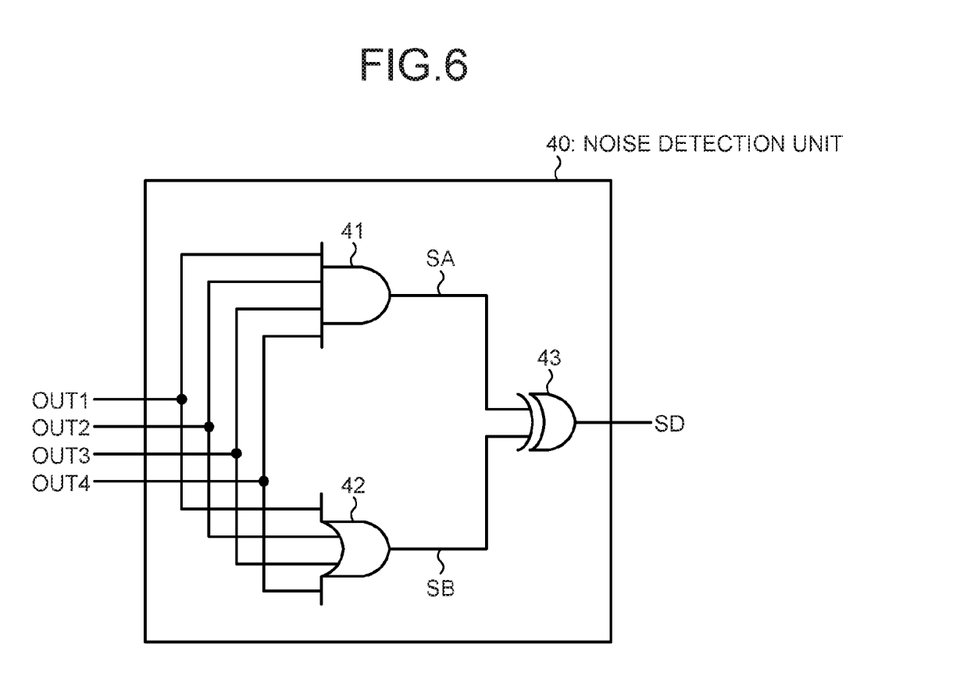
FIG. 6 is a logic diagram for explaining a noise detection function of the noise analysis apparatus according to the first embodiment of the present invention.

FIG. 6 shows an example of a logic configuration of a noise detection unit 40 serving such the noise detection function. The noise detection unit 40 is one functional block of the noise analysis unit 30. The noise detection unit 40 detects, based on the output signals OUT1 to OUT4, presence or absence of a noise in the input signal IN and outputs a noise detection signal SD indicating a result of the detection.

More specifically, the noise detection unit 40 has an AND circuit 41, an OR circuit 42, and an EXOR circuit 43. The AND circuit 41 outputs a signal SA indicating AND of the output signals OUT1 to OUT4. The OR circuit 42 outputs a signal SB indicating OR of the output signals OUT1 to OUT4. The EXOR circuit 43 outputs, as the noise detection signal SD, exclusive OR of the signal SA and the signal SB.

Figure 7:
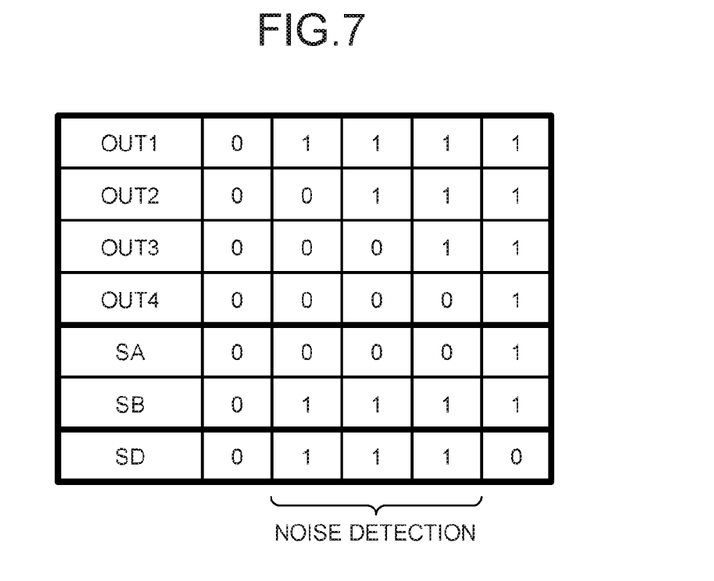
FIG. 7 is a truth table for explaining the noise detection function shown in FIG. 6.

As shown in a truth table in FIG. 7, when the values of the output signals OUT1 to OUT4 coincide with each other, the noise detection signal SD is at Low level. This means that no noise has been detected. On the other hand, when the values of the output signals OUT1 to OUT4 do not coincide with each other, the noise detection signal SD is at High level. This means that a noise has been detected. In view of the above, it can be understood that the noise detection function is achieved with a very simple configuration.

Figure 8:
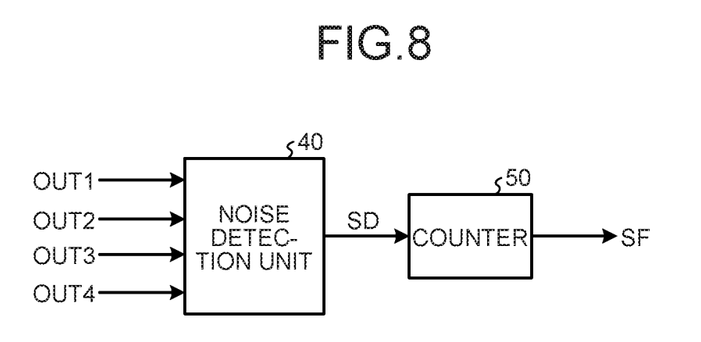
FIG. 8 is a block diagram for explaining another example of functions of the noise analysis apparatus according to the first embodiment of the present invention.

FIG. 8 is a block diagram for explaining another example of the function of the noise analysis unit 30. A counter 50 of the noise analysis unit 30 receives the noise detection signal SD from the noise detection unit 40 described above, and counts the number of times the noise detection signal SD becomes the HIGH level, that is, the number of times the noise has been detected. Then, the counter 50 outputs a noise frequency signal SF indicating a count value obtained during a certain period of time, that is, an occurrence frequency of the noise. In this manner, it is also possible to calculate the occurrence frequency of the noise in the input signal IN, based on the presence or absence of the noise in the input signal IN.

Figure 9:
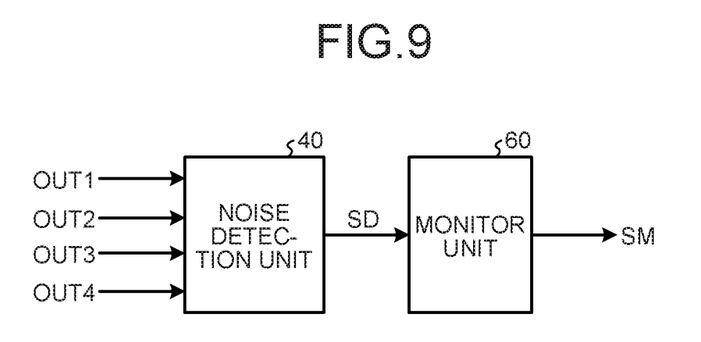
FIG. 9 is a block diagram for explaining still another example of functions of the noise analysis apparatus according to the first embodiment of the present invention.

FIG. 9 is a block diagram for explaining still another example of the function of the noise analysis unit 30. A monitor unit 60 of the noise analysis unit 30 monitors the noise detection signal SD output from the noise detection unit 40 described above, and detects a period of time when the noise detection signal SD is at the High level, that is, a duration of the noise. Then, the monitor unit 60 outputs a noise duration signal SM indicating the detected duration of the noise. In this manner, it is also possible to detect the duration of the noise in the input signal IN, based on the presence or absence of the noise in the input signal IN.

Figure 10:
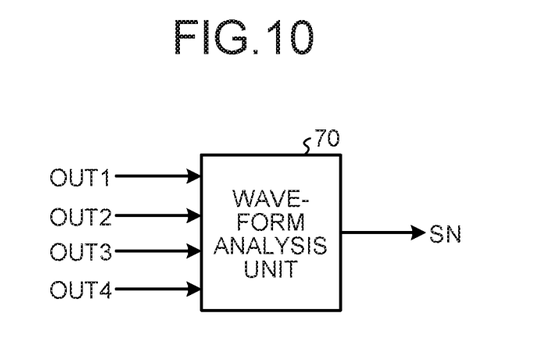
FIG. 10 is a block diagram for explaining still another example of functions of the noise analysis apparatus according to the first embodiment of the present invention.

FIG. 10 is a block diagram for explaining still another example of the function of the noise analysis unit 30. A waveform analysis unit 70 of the noise analysis unit 30 compares the output signals OUT1 to OUT4 to obtain noise information SN regarding a waveform (intensity, period, and the like) of the detected noise.

For example, in both of periods P1 and P2 in FIG. 5, the output signals OUT1 to OUT4 do not coincide with each other and a noise is detected. However, a status of the inconsistency, that is, a "combination" of the output signals OUT1 to OUT4 differs between the periods P1 and P2. Since the filtering time differs between the digital filters 10-1 to 10-4, such the "combination" of the output signals OUT1 to OUT4 includes information on a magnitude of the detected noise. Regarding the fact that the combination of the output signals includes the information on the magnitude of the detected noise, see also the foregoing FIG. 3.

Figure 11:
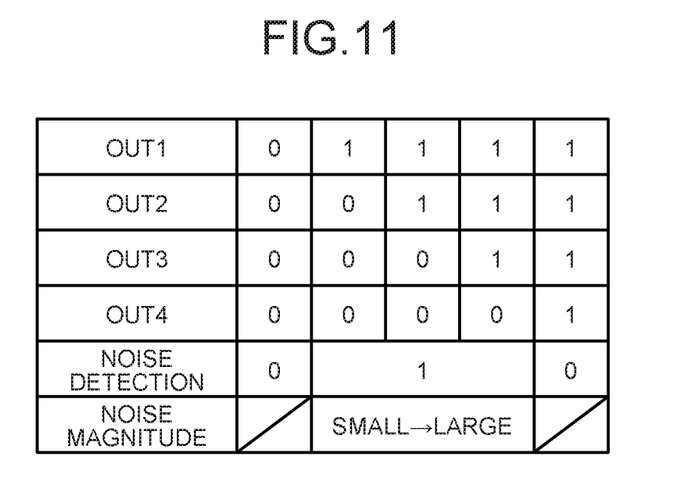
FIG. 11 is a truth table for explaining the function shown in FIG. 10.

Thus, the waveform analysis unit 70 can obtain the information on the magnitude of the detected noise, by comparing the output signals OUT1 to OUT4. The details are as shown in a truth table in FIG. 11. In FIG. 11, a mark "/" denotes that there is no noise, and "small" and "large" represent the magnitude of the detected noise. For example, when comparing a case of "OUT1, OUT2, OUT3, OUT4"="1, 0, 0, 0" and a case of "OUT1, OUT2, OUT3, OUT4"="1, 1, 1, 0", the noise is smaller in the former case and is larger in the latter case.

Note that in order to increase the accuracy of the analysis shown in FIGS. 10 and 11, it is preferable to set the respective filtering times of the plurality of digital filters 10-1 to 10-4 to be different in a stepwise manner. For example, the respective filtering times of the plurality of digital filters 10-1 to 10-4 are set to be equally-spaced.

The noise analysis unit 30 stores the noise information SN obtained by the waveform analysis unit 70 in a storage device such as a RAM and a flash memory. Although a location of the storage device is not specifically limited, the storage device may be included in a microcomputer in a case where the noise analysis unit 30 is achieved by the microcomputer.

It should be realized that the functions described above can be combined with each other.

<Effects>

According to the present embodiment, as described above, it is possible to detect the presence or absence of the noise based on the output signals OUT1 to OUT4 from the plurality of digital filters 10-1 to 10-4. Here, a general-purpose digital filter can be used as the digital filter 10, and there is no need to prepare a circuit dedicated to the noise detection. That is, according to the present embodiment, it is possible to detect the presence or absence of the noise with a simple configuration.

Moreover, according to the present embodiment, it is also possible to detect the occurrence frequency and the duration of the noise based on the presence or absence of the noise. Furthermore, according to the present embodiment, it is also possible to obtain the noise information SN regarding the waveform of the detected noise. Such the information is useful for identifying a noise source under an environment of usage, which contributes to measures against noise and thus to a stable system operation.

Second Embodiment

Figure 12:
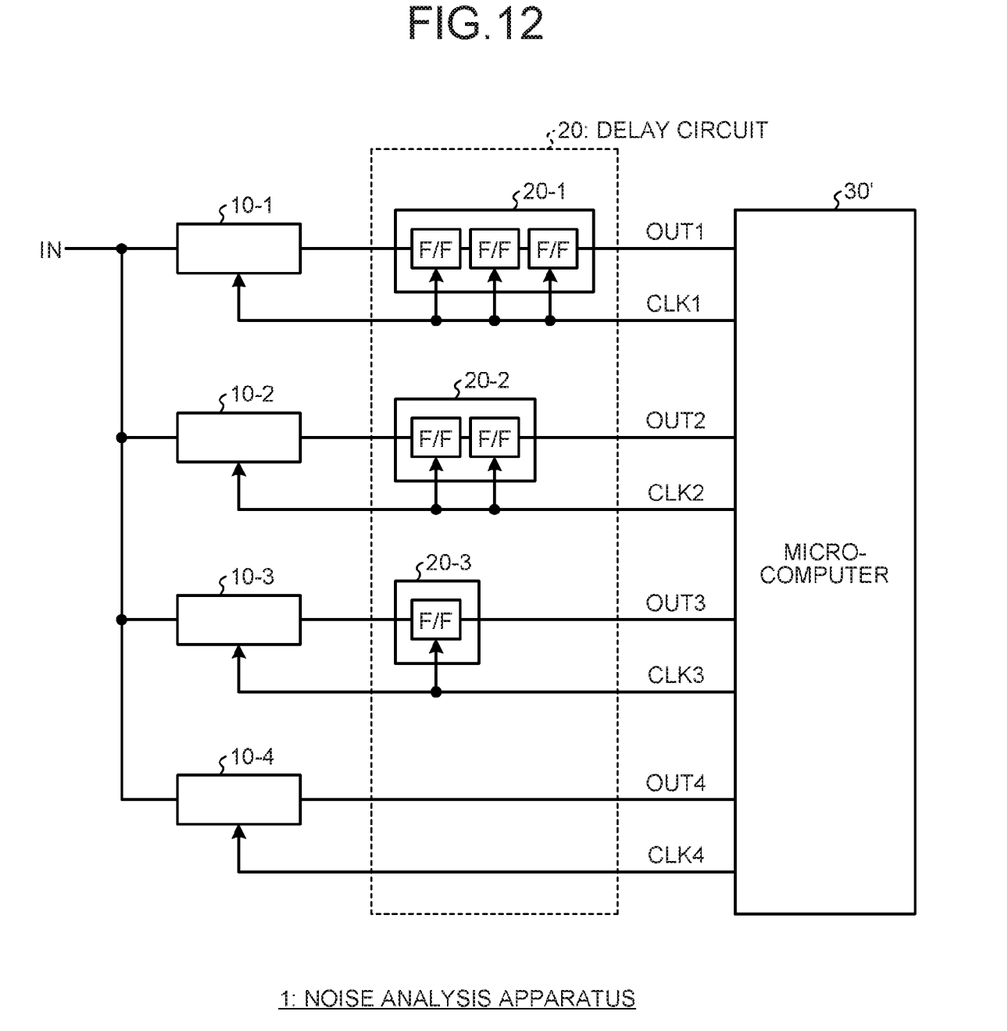
FIG. 12 is a block diagram showing an example of a configuration of a noise analysis apparatus according to a second embodiment of the present invention.

FIG. 12 is a block diagram showing an example of a configuration of the noise analysis apparatus 1 according to a second embodiment. In the present embodiment, the noise analysis unit 30 is achieved by a microcomputer 30'. The clock signals CLK1 to CLK4 are supplied from the microcomputer 30'. The microcomputer 30' executes the functions of the noise analysis unit 30 described above. For example, the microcomputer 30' regularly detects the occurrence frequency and the duration of the noise, and accumulates the detection result as a database. The accumulated database is useful for identifying a noise source.

In a case where the microcomputer 30' has a function of generating the clock signals CLK1 to CLK4, there is no need to generate the clock signals CLK1 to CLK4 by using a separate component. This contributes to reduction of the number of components, simplification of circuits, and space reduction, which is thus preferable.

There is also possibility that although a malfunction due to a noise is caused, the noise cannot be removed by all of the digital filters 10-1 to 10-4. In this case, it can be considered to change the periods of the clock signals CLK1 to CLK4 to reset the respective filtering times. In this case, since the microcomputer 30' has the function of generating the clock signals CLK1 to CLK4, the microcomputer 30' can easily change the periods of the clock signals CLK1 to CLK4, which is preferable.

Third Embodiment

Figure 13:
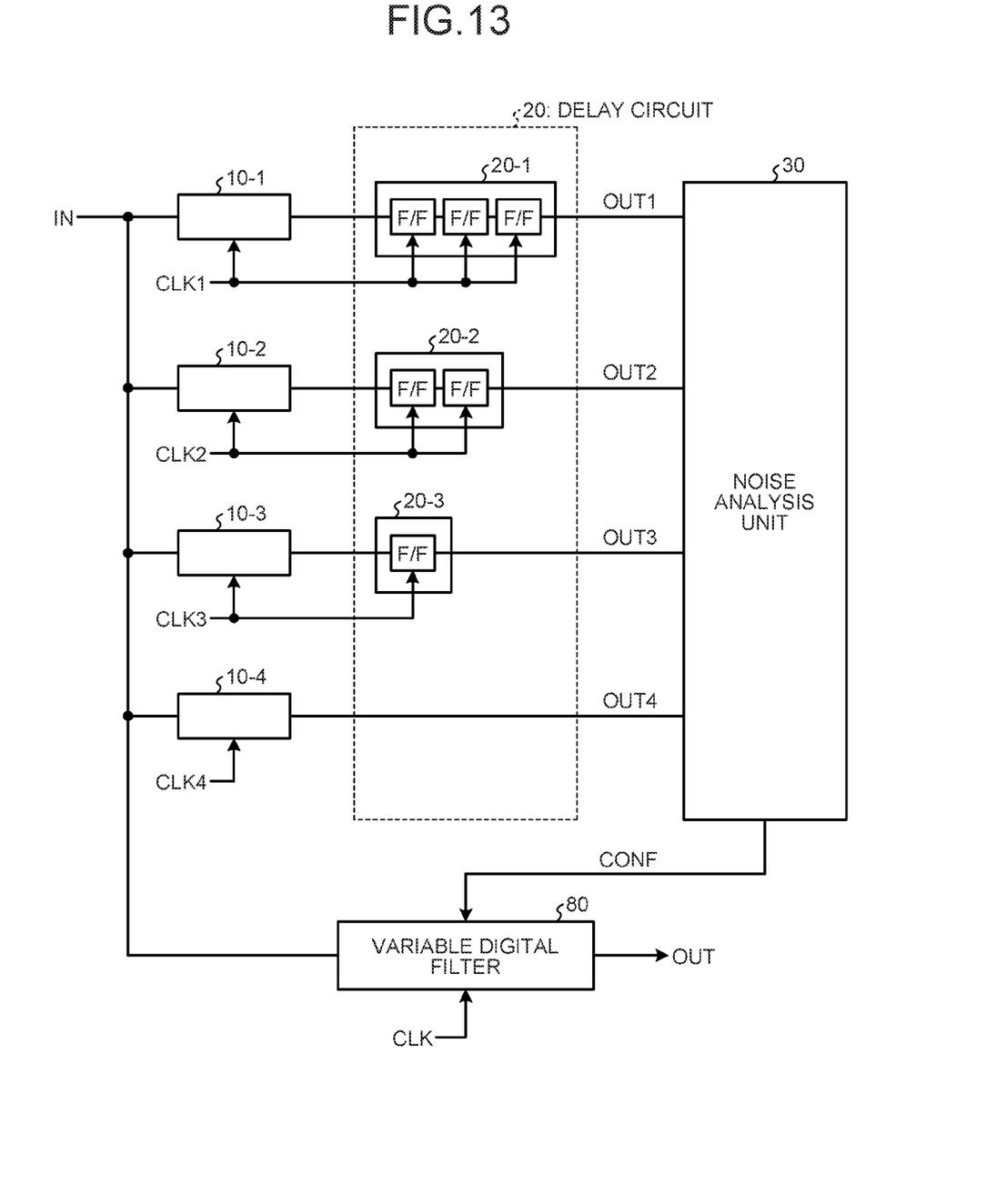
FIG. 13 is a block diagram showing an example of a configuration of an electronic device according to a third embodiment of the present invention.

FIG. 13 shows an example of a configuration of an electronic device to which the noise analysis apparatus 1 is applied. The electronic device shown in FIG. 13 is provided with the above-described noise analysis apparatus 1 and a variable digital filter 80.

The filtering characteristic (filtering time) of the variable digital filter 80 can be variably set by a configuration signal CONF. The same input signal IN is input also to the variable digital filter 80. The variable digital filter 80 performs the filtering of the input signal IN based on the clock signal CLK to output an output signal OUT.

The noise analysis unit 30 of the noise analysis apparatus 1 compares the output signals OUT1 to OUT4 to identify, among the digital filters 10-1 to 10-4, a digital filter 10 capable of removing the noise. Then, the noise analysis unit 30 selects an optimum one digital filter 10 capable of removing the noise, and determines the filtering time of the variable digital filter 80 based on the the filtering time of the selected digital filter 10. Then, the noise analysis unit 30 outputs the configuration signal CONF indicating the determined filtering time to the variable digital filter 80 and thereby automatically sets the filtering time of the variable digital filter 80.

In the example shown in FIG. 5, for example, the digital filters 10-3 and 10-4 can remove the noise. Among the digital filters 10-3 and 10-4, it is the digital filter 10-3 that has a shorter filtering time. Therefore, the noise analysis unit 30 selects the digital filter 10-3 and automatically sets the filtering time of the variable digital filter 80 so as to coincide with the filtering time of the selected digital filter 10-3. In this manner, it is possible to remove the noise in the input signal IN while suppressing a signal delay in the variable digital filter 80. That is, it is possible to prevent malfunction of a system while improving its performance.

The filtering time of the variable digital filter 80 can be manually set. In this case, for example, it is probable that a higher priority is given to the manual setting than to automatic setting in the noise analysis unit 30.

Fourth Embodiment

In the foregoing embodiments, the filtering time differs between the plurality of digital filters 10. Instead, a threshold level for the input signal IN may differ between the plurality of digital filters 10.

Figure 14:
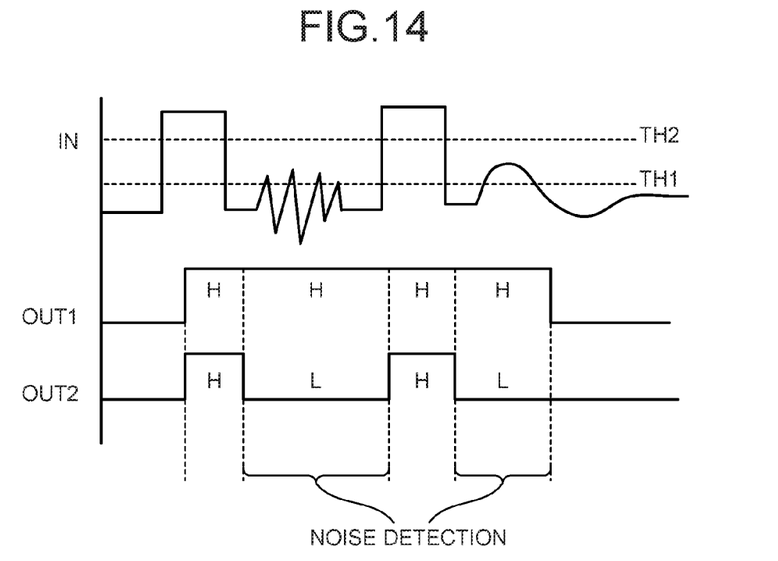
FIG. 14 is a timing chart showing an example of an operation of a digital filter according to a fourth embodiment of the present invention.

For example, in an example shown in FIG. 14, a threshold level TH1 for the digital filter 10-1 is set to be lower than a threshold level TH2 for the digital filter 10-2. Accordingly, the digital filter 10-1 takes in even a minute noise as the input signal IN, and consequently there is a period of time when the output signal OUT1 and the output signal OUT2 do not coincide with each other. Therefore, as in the case of the foregoing embodiments, the noise analysis unit 30 can detect the presence or absence of the noise in the input signal IN based on whether or not the values of the output signals OUT1 and OUT2 coincide with each other.

Furthermore, since the plurality of digital filters 10 having mutually different threshold levels, it is possible to determine a level of the detected noise. Accuracy of determination of the noise level is increased by increasing the number of digital filters 10 to make a difference between the threshold levels smaller.

Fifth Embodiment

Figure 15:
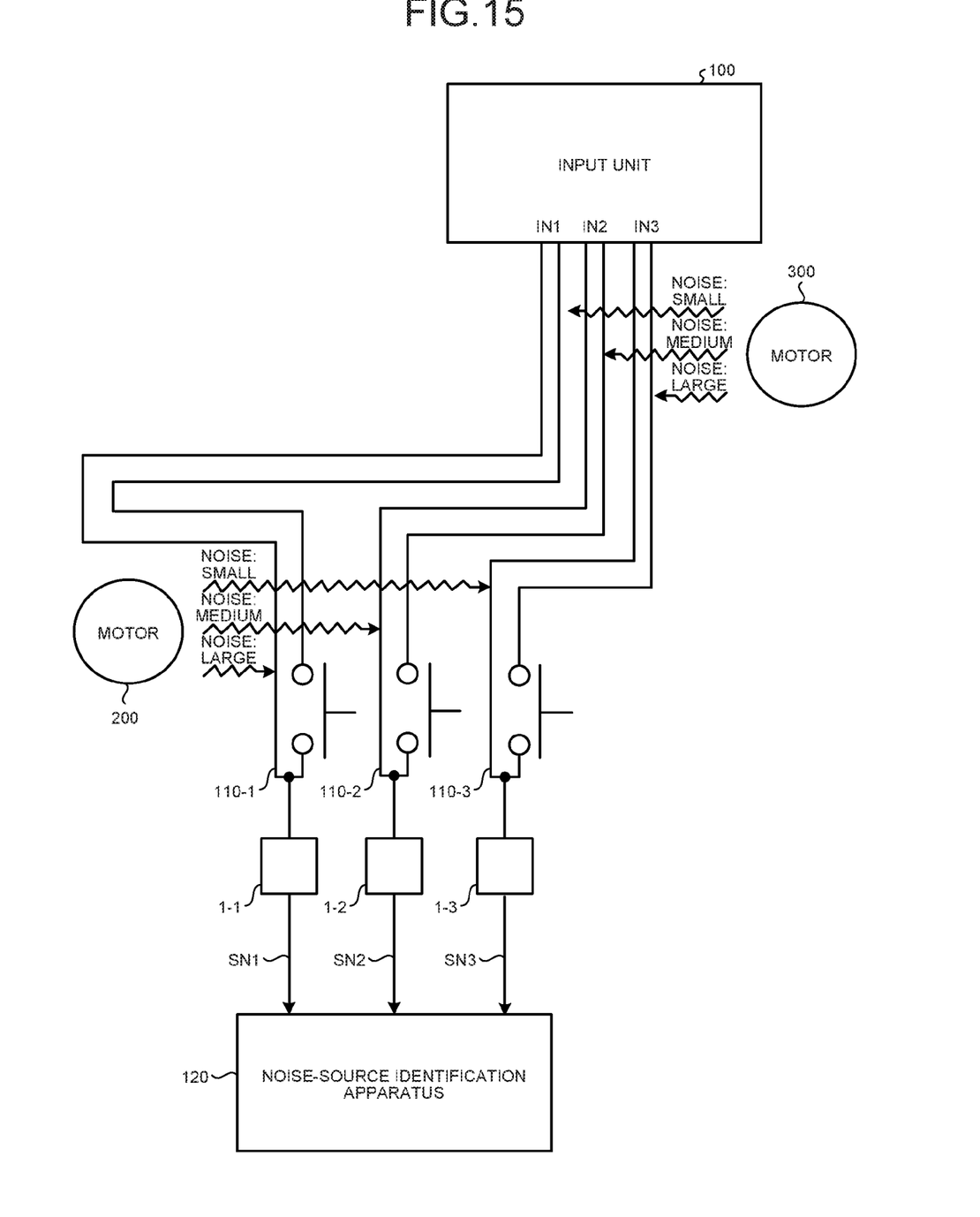
FIG. 15 is a block diagram showing an example of a configuration of a noise-source identification system according to a fifth embodiment of the present invention.

FIG. 15 shows an application example of the noise analysis apparatus 1. More specifically, FIG. 15 shows a configuration of an input unit 100 of a sequencer system and peripheral units thereof. The input unit 100 receives input signals IN1 to IN3 from a plurality of switches through signal lines 110-1 to 110-3, respectively. A motor 200 is placed in the vicinity of the signal line 110-1, and a motor 300 is placed in the vicinity of the signal line 110-3.

Here, noise analysis apparatuses 1-1 to 1-3 are applied to the signal lines 110-1 to 110-3 (the input signals IN1 to IN3), respectively. The noise analysis apparatuses 1-1 to 1-3 obtain noise information SN1 to SN3 as shown in the foregoing FIG. 10 with regard to the input signals IN1 to IN3, respectively. A noise-source identification apparatus 120 receives the noise information SN1 to SN3 from the noise analysis apparatuses 1-1 to 1-3 and identifies a noise source based on the noise information SN1 to SN3.

For example, in a case where a detected noise related to the signal line 110-1 (the input signal IN1) is the largest and a detected noise related to the signal line 110-3 (the input signal IN3) is the smallest, the noise-source identification apparatus 120 identifies the motor 200 as the noise source. On the other hand, in a case where the detected noise related the signal line 110-3 (the input signal IN3) is the largest and the detected noise related the signal line 110-1 (the input signal IN1) is the smallest, the noise-source identification apparatus 120 identifies the motor 300 as the noise source.

After the noise source is identified, noise countermeasures can be easily taken by, for example, changing a wiring route in the vicinity of the identified noise source. In this manner, it is possible by effectively utilizing the noise information to take the noise countermeasures to contribute to a stable system operation.

It should be noted that the noise analysis apparatuses 1-1 to 1-3 and the noise-source identification apparatus 120 shown in FIG. 15 constitute a "noise-source identification system" as a whole.

Embodiments of the present invention have been described with reference to the accompanying drawings. It should be noted that the present invention is not limited to the embodiments described above and can be modified as appropriate by persons skilled in the art without departing from the scope thereof.

REFERENCE SIGNS LIST

1, 1-1 to 1-3 noise analysis apparatus, 10, 10-1 to 10-4 digital filter, 11 D flip-flop, 12 AND circuit, 13 negative logic OR circuit, 14 RS flip-flop, 20 delay circuit, 20-1, 20-2, 20-3 delay element, 30 noise analysis unit, 30' microcomputer, 40 noise detection unit, 41 AND circuit, 42 OR circuit, 43 EXOR circuit, 50 counter, 60 monitor unit, 70 waveform analysis unit, 80 variable digital filter, 100 input unit, 110-1 to 110-3 signal line, 120 noise-source identification apparatus, 200 motor, 300 motor, CLK, CLK1 to CLK4, CLK-A, CLK-B clock signal, CONF configuration signal, FT-A, FT-B filtering time, IN, IN1 to IN3 input signal, OUT, OUT1 to OUT4, OUT-A, OUT-B output signal, SD noise detection signal, SF noise frequency signal, SM noise duration signal, SN, SN1 to SN3 noise information.

The invention claimed is:

1. A noise analysis apparatus comprising:
a plurality of digital filters to have mutually different filtering characteristics and filter a same input signal to output a plurality of output signals, respectively; and
a noise analyzer to detect presence or absence of a noise in the same input signal based on whether or not amplitude values of the plurality of output signals that is filtered out from the same input signal coincide with each other, and calculate an occurrence frequency of the noise based on the presence or absence of the noise in the same input signal.

2. The noise analysis apparatus according to claim 1, wherein the filtering characteristics are filtering times.

3. The noise analysis apparatus according to claim 2, wherein the filtering times of the plurality of digital filters are different in a stepwise manner.

4. The noise analysis apparatus according to claim 2, wherein the filtering times of the plurality of digital filters are reset by changing periods of clock signals respectively applied to the plurality of digital filters.

5. The noise analysis apparatus according to claim 1, wherein the filtering characteristics are threshold levels for the same input signal.

6. The noise analysis apparatus according to claim 1, wherein the noise analyzer compares the plurality of output signals to obtain noise information on a waveform of the detected noise.

7. A noise-source identification system comprising:
the noise analysis apparatus according to claim 6;
a plurality of signal lines to which the noise analysis apparatus is applied; and
a noise-source identification apparatus to identify a noise source based on the noise information regarding the plurality of signal lines.

8. An electronic device comprising:
the noise analysis apparatus according to claim 1; and
a variable digital filter whose filtering characteristic is variable and to which the same input signal is input,
wherein the noise analysis analyzer compares the plurality of output signals to identify, among the plurality of digital filters, a digital filter capable of removing the noise and sets the filtering characteristic of the variable digital filter based on the filtering characteristic of the identified digital filter.

9. A noise analysis apparatus comprising:
a plurality of digital fillers to have mutually different filtering characteristics and filter a same input signal to output a plurality of output signals, respectively;
a noise analyzer to detect presence or absence of a noise in the same input signal, based on whether or not amplitude values of the plurality of output signals that is filtered out from the same input signal coincide with each other; and
a delay circuit provided between the plurality of digital filters and the noise analyzer to reduce a difference in a signal delay between the plurality of digital filters.

10. A noise analysis apparatus comprising:
a plurality of digital filters to have mutually different filtering characteristics and filter a same input signal to output a plurality of output signals, respective; and
a noise analyzer to detect presence or absence of a noise in the same input signal based on whether or not amplitude values of the plurality of output signals that is filtered out from the same input signal coincide with each other, and detect a duration of the noise based on the presence or absence of the noise in the same input signal.

* * * * *